(12) United States Patent
Huang

(10) Patent No.: US 11,239,447 B2
(45) Date of Patent: Feb. 1, 2022

(54) OLED DISPLAY PANEL AND MANUFACTURING METHOD THEREOF

(71) Applicant: Shenzhen China Star Optoelectronics Technology Co., Ltd., Shenzhen (CN)

(72) Inventor: Hui Huang, Shenzhen (CN)

(73) Assignee: SHENZHEN CHINA STAR OPTOELECTRONICS TECHNOLOGY CO., LTD., Guangdong (CN)

(*) Notice: Subject to any disclaimer, the term of this patent is extended or adjusted under 35 U.S.C. 154(b) by 349 days.

(21) Appl. No.: 16/307,139

(22) PCT Filed: Sep. 17, 2018

(86) PCT No.: PCT/CN2018/105908
§ 371 (c)(1),
(2) Date: Dec. 5, 2018

(87) PCT Pub. No.: WO2019/218555
PCT Pub. Date: Nov. 21, 2019

(65) Prior Publication Data
US 2021/0083229 A1    Mar. 18, 2021

(30) Foreign Application Priority Data
May 16, 2018  (CN) .......................... 201810469311.0

(51) Int. Cl.
*H01L 51/52*        (2006.01)
*H01L 51/56*        (2006.01)

(52) U.S. Cl.
CPC .......... *H01L 51/5268* (2013.01); *H01L 51/56* (2013.01); *H01L 51/5253* (2013.01); *H01L 2251/5369* (2013.01); *H01L 2251/558* (2013.01)

(58) Field of Classification Search
CPC .. H01L 51/5268; H01L 51/56; H01L 51/5253
See application file for complete search history.

(56) References Cited

U.S. PATENT DOCUMENTS

2008/0272367 A1    11/2008  Cok
2014/0246689 A1*    9/2014  Luo ........................ H01L 33/504
257/98

(Continued)

FOREIGN PATENT DOCUMENTS

CN          2610361 Y       4/2004
CN        102738403 A      10/2012

(Continued)

*Primary Examiner* — Christine A Enad
(74) *Attorney, Agent, or Firm* — Leong C. Lei

(57) ABSTRACT

The invention provides an OLED display panel and manufacturing method thereof. The manufacturing method of OLED display panel of the invention forms a first scattering layer on the thin film encapsulation layer, a quantum dot layer on the first scattering layer, and a second scattering layer on the quantum dot layer. The first scattering layer extracts light from the OLED device, so that the light totally reflected by OLED device through thin film encapsulation layer is emitted as much as possible; the light extracted by the first scattering layer reaches the quantum dot layer. The quantum dots are excited to perform light color matching to emit light of desired color. Since the light excited by quantum dot layer is dispersed, the second scattering layer extracts the light excited by the quantum dot layer in an orderly manner, so that the OLED display panel emits light uniformly, thereby improving luminous efficiency.

10 Claims, 3 Drawing Sheets

(56) References Cited

U.S. PATENT DOCUMENTS

| | | | |
|---|---|---|---|
| 2015/0062515 A1 | 3/2015 | Tomioka | |
| 2018/0175265 A1* | 6/2018 | Kim | H01L 33/504 |
| 2018/0190938 A1* | 7/2018 | Wang | H01L 51/5256 |
| 2019/0081218 A1* | 3/2019 | Dawson-Elli | H01L 33/56 |
| 2019/0157354 A1* | 5/2019 | Lee | H01L 33/501 |
| 2019/0198728 A1* | 6/2019 | Tam | H01L 33/502 |
| 2021/0231858 A1* | 7/2021 | Wang | G02B 5/1866 |

FOREIGN PATENT DOCUMENTS

| | | |
|---|---|---|
| CN | 103403892 A | 11/2013 |
| CN | 204389840 U | 6/2015 |
| CN | 105247408 A | 1/2016 |
| CN | 105652526 A | 6/2016 |
| CN | 106848080 A | 6/2017 |
| CN | 107731868 A | 2/2018 |
| CN | 108508667 A | 9/2018 |

\* cited by examiner

OLED DISPLAY PANEL AND MANUFACTURING METHOD THEREOF

BACKGROUND OF THE INVENTION

1. Field of the Invention

The present invention relates to the field of display, and in particular to an organic light-emitting diode (OLED) display panel and manufacturing method thereof.

2. The Related Arts

The organic light-emitting diode (OLED) display device, also known as an organic electroluminescent display, is an emerging panel display device. The OLED display device provides the advantages of self-luminous, low driving voltage, high luminous efficiency, short response time, high definition and contrast, near 180° viewing angle, wide temperature range, and ability to realize flexible display and larges-size full-color display, and so on, and are recognized by the industry as the most promising display device.

The OLED device generally comprises a substrate, an anode disposed on the substrate, a hole injection layer disposed on the anode, a hole transport layer disposed on the hole injection layer, a light-emitting layer disposed on the hole transport layer, an electron transport layer disposed on the light-emitting layer, an electron injection layer disposed on the electron transport layer, and a cathode disposed on the electron injection layer. The light emission principle of OLED devices is that semiconductor materials and organic materials and light-emitting materials are driven by electric fields, causing carrier injection and recombination to emit light. Specifically, an OLED device generally uses an indium tin oxide (ITO) electrode and a metal electrode as anodes and cathodes of the device, respectively. Under a certain voltage, electrons and holes are injected from the cathode and the anode into the electron injection layer and the hole injection layer, respectively. The electrons and holes migrate to the light-emitting layer through the electron transport layer and the hole transport layer, respectively, and meet in the light-emitting layer to form excitons and excite the light-emitting molecules, and the latter emits visible light through radiation relaxation.

Due to the refractive index at the interface, the OLED device will undergo total reflection during the light-emitting process. Most of the light cannot be effectively extracted due to refraction or reflection inside the OLED display panel, resulting in more light loss. Most of the known methods to extract more light are mostly to improve the inside the OLED device and inside the glass substrate. But this type of method is difficult to implement and the chromaticity of the OLED device is not effectively guaranteed. Or, an external light extraction device is directly added. Adding an external light extraction device will increase the thickness of the overall OLED display panel, which is not conducive to future commercial production.

SUMMARY OF THE INVENTION

The object of the present invention is to provide a manufacturing method of OLED display panel, enabling the OLED display panel to uniformly emit light to improve the luminous efficiency.

Another object of the present invention is to provide an OLED display panel, able to uniformly emit light to improve the luminous efficiency.

To achieve the above object, the present invention provides a manufacturing method of OLED display panel, which comprises:

Step S1: providing a substrate, forming an OLED device on the substrate, forming a thin film encapsulation layer covering the OLED device on the substrate;

Step S2: forming a first scattering layer on the thin film encapsulation layer;

Step S3: forming a quantum dot layer on the first scattering layer;

Step S4: forming a second scattering layer on the quantum dot layer.

Wherein, in step S1, a vacuum film formation method is used to form the thin film encapsulation layer covering the OLED device on the substrate; in step S2, an atomic layer deposition or coating method is used to form the first scattering layer on the thin film encapsulation layer.

Wherein, in step S3, a solution method is used to form the quantum dot layer on the first scattering layer.

Wherein, in step S4, an ion exchange self-assembly method is used to form the second scattering layer of a nano-mesh film structure on the quantum dot layer.

Wherein, material of the thin film encapsulation layer is silicon oxide or silicon nitride and thickness of the thin film encapsulation layer is 2-10 um; material of the first scattering layer is inorganic oxide particles and thickness of the first scattering layer is less than 20 um; material of the quantum dot layer is cadmium sulfide or cadmium selenide and thickness of the quantum dot layer is less than 10 um; material of the second scattering layer is multi-arm titanium dioxide or multi-arm cadmium sulfide nanorod and thickness of the second scattering layers is less than 10 um.

The present invention also provides an OLED display panel, which comprises: a substrate, an OLED device disposed on the substrate, a thin film encapsulation layer disposed on the substrate and covering the OLED device, a first scattering layer disposed on the thin film encapsulation layer, and a quantum dot layer disposed on the first scattering layer and a second scattering layer disposed on the quantum dot layer.

Wherein, a vacuum film formation method is used to form the thin film encapsulation layer covering the OLED device on the substrate; an atomic layer deposition or coating method is used to form the first scattering layer on the thin film encapsulation layer.

Wherein, a solution method is used to form the quantum dot layer on the first scattering layer.

Wherein, an ion exchange self-assembly method is used to form the second scattering layer of a nano-mesh film structure on the quantum dot layer.

Wherein, material of the thin film encapsulation layer is silicon oxide or silicon nitride and thickness of the thin film encapsulation layer is 2-10 um; material of the first scattering layer is inorganic oxide particles and thickness of the first scattering layer is less than 20 um; material of the quantum dot layer is cadmium sulfide or cadmium selenide and thickness of the quantum dot layer is less than 10 um; material of the second scattering layer is multi-arm titanium dioxide or multi-arm cadmium sulfide nanorod and thickness of the second scattering layers is less than 10 um.

In summary, in the manufacturing method of OLED display panel of the present invention, by forming a first scattering layer on the thin film encapsulation layer, forming a quantum dot layer on the first scattering layer and forming a second scattering layer on the quantum dot layer, the first scattering layer extracts light from the OLED device, so that the light totally reflected by the OLED device through the thin film encapsulation layer is emitted as much as possible; the light extracted by the first scattering layer reaches the quantum dot layer, and the quantum dots are excited to perform light color matching to emit the light of the desired color; since the light excited by the quantum dot layer is disordered and dispersed, the second scattering layer extracts the light excited by the quantum dot layer in an orderly manner, so that the OLED display panel emits light uniformly, thereby improving luminous efficiency. The OLED display panel of the invention emits light uniformity and achieves high luminous efficiency.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

To further explain the technical means and effect of the present invention, the following refers to embodiments and drawings for detailed description.

Figure 1:
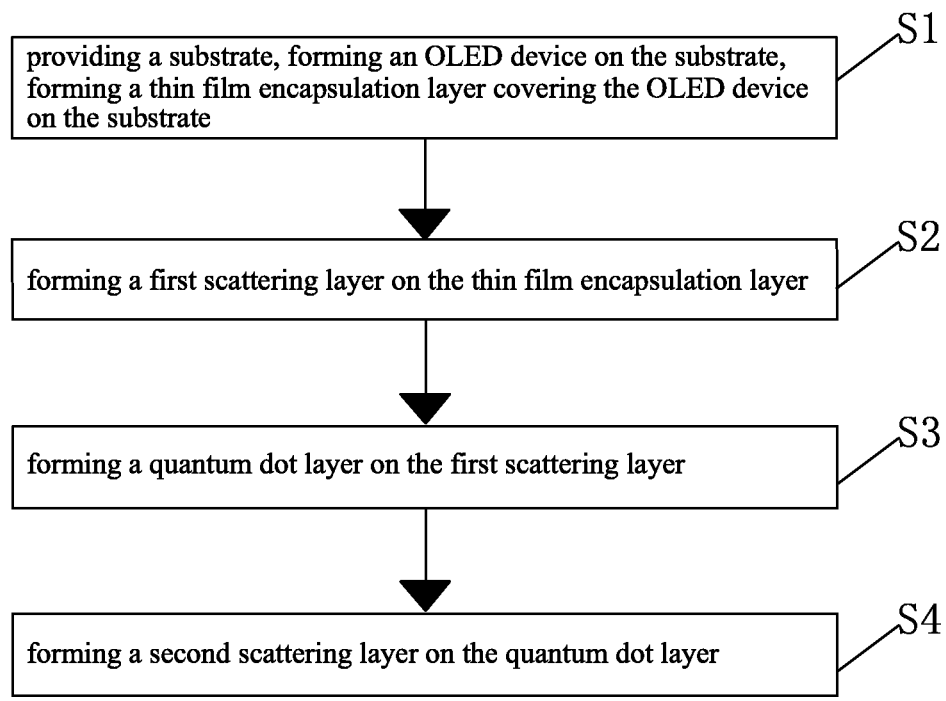
FIG. 1 is a schematic view showing the flowchart of the manufacturing method of OLED display panel of the present invention.
Figure 2:
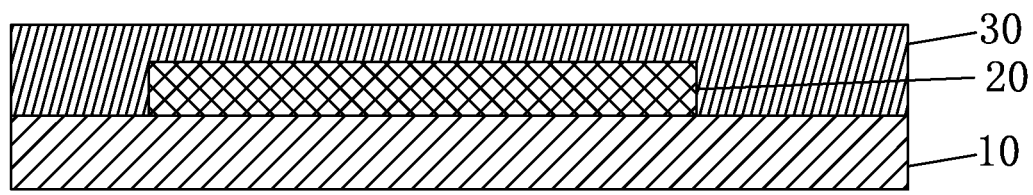
FIG. 2 is a schematic view showing step S1 of the manufacturing method of OLED display panel of the present invention.
Figure 3:
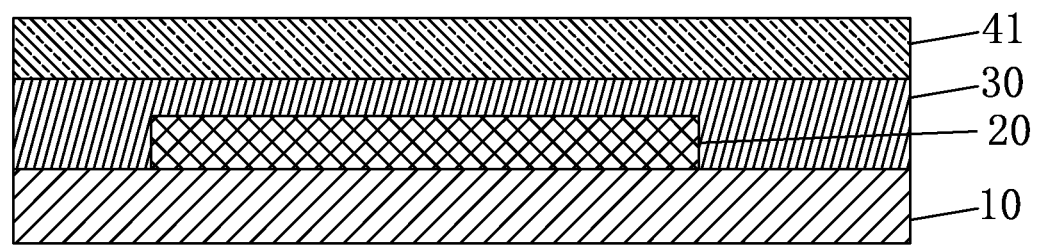
FIG. 3 is a schematic view showing step S2 of the manufacturing method of OLED display panel of the present invention.
Figure 4:
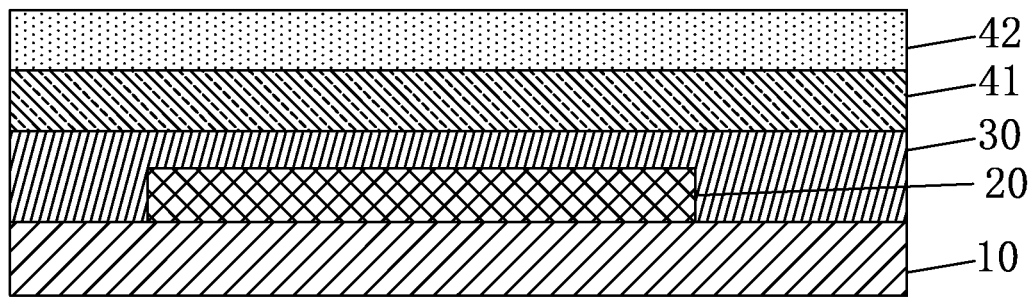
FIG. 4 is a schematic view showing step S3 of the manufacturing method of OLED display panel of the present invention.
Figure 5:
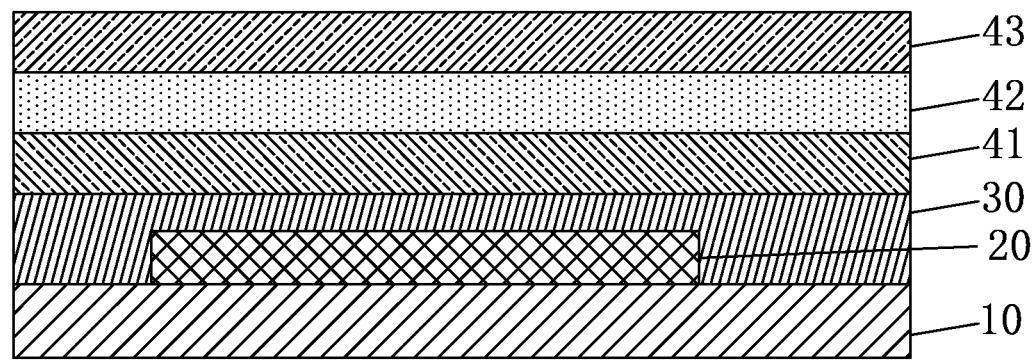
FIG. 5 is a schematic view showing step S4 of the manufacturing method of OLED display panel and the structure of the OLED display panel of the present invention.

Refer to FIG. 1. The manufacturing method of OLED display panel of the present invention comprises the following steps:

Step S1: as shown in FIG. 2, providing a substrate 10, forming an OLED device 20 on the substrate 10, forming a thin film encapsulation layer 30 covering the OLED device 20 on the substrate 10;

Step S2: as shown in FIG. 3, forming a first scattering layer 41 on the thin film encapsulation layer 30;

Step S3: as shown in FIG. 4, forming a quantum dot layer 42 on the first scattering layer 41;

Step S4: as shown in FIG. 5, forming a second scattering layer 43 on the quantum dot layer 42.

It should be noted that the manufacturing method of OLED display panel of the present invention forms a first scattering layer 41 on the thin film encapsulation layer 30, a quantum dot layer 42 on the first scattering layer 41 and a second scattering layer 43 on the quantum dot layer 42; the first scattering layer 41 extracts light from the OLED device 20, so that the light totally reflected by the OLED device 20 through the thin film encapsulation layer 30 is emitted as much as possible; the light extracted by the first scattering layer 41 reaches the quantum dot layer 42, and the quantum dots are excited to perform light color matching to emit the light of the desired color; since the light excited by the quantum dot layer 42 is disordered and dispersed, the second scattering layer 43 extracts the light excited by the quantum dot layer 42 in an orderly manner, so that the OLED display panel emits light uniformly, thereby improving luminous efficiency.

Specifically, the emitted light from the OLED device 20 is ultraviolet light or blue light, which is advantageous for reducing the preparation difficulty of the OLED device 20 and has a wider excitation wavelength range as well as a larger adjustable light color range. When the emitted light from the OLED device 20 is ultraviolet light or blue light, the quantum dot layer 42 excites the quantum dots to emit white light.

Specifically, in step S1, a vacuum film formation method is used to form the thin film encapsulation layer 30 covering the OLED device 20 on the substrate 10.

Moreover, the material of the thin film encapsulation layer 30 is silicon oxide or silicon nitride and the thickness of the thin film encapsulation layer 30 is 2-10 um.

Moreover, the thin film encapsulation layer 30 is a structure having a plurality of barrier layers and a plurality of buffer layers alternately stacked to improve the ability to block water and oxygen.

Specifically, in step S2, an atomic layer deposition (ALD) or coating method is used to form the first scattering layer 41 on the thin film encapsulation layer 30.

Moreover, material of the first scattering layer 41 is inorganic oxide particles, such as, ZnO, ZrO2, with higher refraction index and advantageous to light extraction; and the thickness of the first scattering layer 41 is less than 20 um.

Specifically, in step S3, a solution method is used to form the quantum dot layer 42 on the first scattering layer 41. The solution is ethanol, isopropanol or acetone, and an organic solvent is formed by adding an emulsifier and a dispersing agent.

Specifically, the material of the quantum dot layer 42 is cadmium sulfide (CdS) or cadmium selenide (CdSe) and the thickness of the quantum dot layer 42 is less than 10 um.

Specifically, in step S4, an ion exchange self-assembly method is used to form the second scattering layer 43 of a nano-mesh film structure on the quantum dot layer 42. The nano-mesh film has good uniformity and order structure and is favorable for orderly extracting light excited by the quantum dot layer 42.

Specifically, the material of the second scattering layer 43 is multi-arm titanium dioxide or multi-arm cadmium sulfide nanorod and the thickness of the second scattering layers 43 is less than 10 um.

Refer to FIG. 5. Based on the above manufacturing method, the present invention also provides an OLED display panel, comprising: a substrate 10, an OLED device 20 disposed on the substrate 10, a thin film encapsulation layer 30 disposed on the substrate 10 and covering the OLED device 20, a first scattering layer 41 disposed on the thin film encapsulation layer 30, and a quantum dot layer 42 disposed on the first scattering layer 41 and a second scattering layer 43 disposed on the quantum dot layer 42.

It should be noted that the OLED display panel of the present invention forms a first scattering layer 41 on the thin film encapsulation layer 30, a quantum dot layer 42 on the first scattering layer 41 and a second scattering layer 43 on the quantum dot layer 42; the first scattering layer 41 extracts light from the OLED device 20, so that the light totally reflected by the OLED device 20 through the thin film encapsulation layer 30 is emitted as much as possible; the light extracted by the first scattering layer 41 reaches the quantum dot layer 42, and the quantum dots are excited to perform light color matching to emit the light of the desired color; since the light excited by the quantum dot layer 42 is disordered and dispersed, the second scattering layer 43 extracts the light excited by the quantum dot layer 42 in an orderly manner, so that the OLED display panel emits light uniformly, thereby improving luminous efficiency.

Specifically, the emitted light from the OLED device 20 is ultraviolet light or blue light, which is advantageous for reducing the preparation difficulty of the OLED device 20 and has a wider excitation wavelength range as well as a larger adjustable light color range. When the emitted light from the OLED device 20 is ultraviolet light or blue light, the quantum dot layer 42 excites the quantum dots to emit white light.

Specifically, a vacuum film formation method is used to form the thin film encapsulation layer 30 covering the OLED device 20 on the substrate 10.

Moreover, the material of the thin film encapsulation layer 30 is silicon oxide or silicon nitride and the thickness of the thin film encapsulation layer 30 is 2-10 um.

Moreover, the thin film encapsulation layer 30 is a structure having a plurality of barrier layers and a plurality of buffer layers alternately stacked to improve the ability to block water and oxygen.

Specifically, an atomic layer deposition (ALD) or coating method is used to form the first scattering layer 41 on the thin film encapsulation layer 30.

Moreover, material of the first scattering layer 41 is inorganic oxide particles, such as, ZnO, ZrO2, with higher refraction index and advantageous to light extraction; and the thickness of the first scattering layer 41 is less than 20 um.

Specifically, a solution method is used to form the quantum dot layer 42 on the first scattering layer 41. The solution is ethanol, isopropanol or acetone, and an organic solvent is formed by adding an emulsifier and a dispersing agent.

Specifically, the material of the quantum dot layer 42 is cadmium sulfide (CdS) or cadmium selenide (CdSe) and the thickness of the quantum dot layer 42 is less than 10 um.

Specifically, an ion exchange self-assembly method is used to form the second scattering layer 43 of a nano-mesh film structure on the quantum dot layer 42. The nano-mesh film has good uniformity and order structure and is favorable for orderly extracting light excited by the quantum dot layer 42.

Specifically, the material of the second scattering layer 43 is multi-arm titanium dioxide or multi-arm cadmium sulfide nanorod and the thickness of the second scattering layers 43 is less than 10 um.

In summary, in the manufacturing method of OLED display panel of the present invention, by forming a first scattering layer on the thin film encapsulation layer, forming a quantum dot layer on the first scattering layer and forming a second scattering layer on the quantum dot layer, the first scattering layer extracts light from the OLED device, so that the light totally reflected by the OLED device through the thin film encapsulation layer is emitted as much as possible; the light extracted by the first scattering layer reaches the quantum dot layer, and the quantum dots are excited to perform light color matching to emit the light of the desired color; since the light excited by the quantum dot layer is disordered and dispersed, the second scattering layer extracts the light excited by the quantum dot layer in an orderly manner, so that the OLED display panel emits light uniformly, thereby improving luminous efficiency. The OLED display panel of the invention emits light uniformity and achieves high luminous efficiency.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A manufacturing method of organic light-emitting diode (OLED) display panel, comprising:
    Step S1: providing a substrate, forming an OLED device on the substrate, forming a thin film encapsulation layer covering the OLED device on the substrate;
    Step S2: forming a first scattering layer on the thin film encapsulation layer;
    Step S3: forming a quantum dot layer on the first scattering layer;
    Step S4: forming a second scattering layer on the quantum dot layer,
    wherein the first scattering layer that is located on a first surface of the quantum dot layer adjacent to the OLED device has a first light scattering mechanism and the second scattering layer that is located on a second surface of the quantum dot layer distant from the OLED device has a second light scattering mechanism, and the second light scattering mechanism of the second scattering layer that is distant from the OLED device comprises a net-like structure and is different from the first light scattering mechanism of the first scattering layer that is of a non-net-like structure located adjacent to the OLED device, wherein the quantum dot layer is sandwiched between the non-net-like structure of the first scattering layer and the net-like structure of the second scattering layer so that different scattering mechanisms in the form of the net-like structure and non-net-like structure are respectively provided on two opposite surfaces of the quantum dot layer.

2. The manufacturing method of OLED display panel as claimed in claim 1, wherein in step S1, a vacuum film formation method is used to form the thin film encapsulation layer covering the OLED device on the substrate; in step S2, an atomic layer deposition or coating method is used to form the first scattering layer on the thin film encapsulation layer.

3. The manufacturing method of OLED display panel as claimed in claim 1, wherein in step S3, a solution method is used to form the quantum dot layer on the first scattering layer.

4. The manufacturing method of OLED display panel as claimed in claim 1, wherein in step S4, an ion exchange self-assembly method is used to form the second scattering layer of a nano-mesh film structure on the quantum dot layer.

5. The manufacturing method of OLED display panel as claimed in claim 1, wherein material of the thin film encapsulation layer is silicon oxide or silicon nitride and thickness of the thin film encapsulation layer is 2-10 um; material of the first scattering layer is inorganic oxide particles and thickness of the first scattering layer is less than 20 um; material of the quantum dot layer is cadmium sulfide or cadmium selenide and thickness of the quantum dot layer is less than 10 um;
material of the second scattering layer is multi-arm titanium dioxide or multi-arm cadmium sulfide nanorod and thickness of the second scattering layers is less than 10 um.

6. An organic light-emitting diode (OLED) display panel, which comprises: a substrate, an OLED device disposed on the substrate, a thin film encapsulation layer disposed on the substrate and covering the OLED device, a first scattering layer disposed on the thin film encapsulation layer, and a quantum dot layer disposed on the first scattering layer and a second scattering layer disposed on the quantum dot layer,
wherein the first scattering layer that is located on a first surface of the quantum dot layer adjacent to the OLED device has a first light scattering mechanism and the second scattering layer that is located on a second surface of the quantum dot layer distant from the OLED device has a second light scattering mechanism, and the second light scattering mechanism of the second scattering layer that is distant from the OLED device comprises a net-like structure and is different from the first light scattering mechanism of the first scattering layer that is of a non-net-like structure located adjacent to the OLED device, wherein the quantum dot layer is sandwiched between the non-net-like structure of the first scattering layer and the net-like structure of the second scattering layer so that different scattering mechanisms in the form of the net-like structure and non-net-like structure are respectively provided on two opposite surfaces of the quantum dot layer.

7. The OLED display panel as claimed in claim 6, wherein a vacuum film formation method is used to form the thin film encapsulation layer covering the OLED device on the substrate; an atomic layer deposition or coating method is used to form the first scattering layer on the thin film encapsulation layer.

8. The OLED display panel as claimed in claim 6, wherein a solution method is used to form the quantum dot layer on the first scattering layer.

9. The OLED display panel as claimed in claim 6, wherein an ion exchange self-assembly method is used to form the second scattering layer of a nano-mesh film structure on the quantum dot layer.

10. The OLED display panel as claimed in claim 6, wherein material of the thin film encapsulation layer is silicon oxide or silicon nitride and thickness of the thin film encapsulation layer is 2-10 um; material of the first scattering layer is inorganic oxide particles and thickness of the first scattering layer is less than 20 um; material of the quantum dot layer is cadmium sulfide or cadmium selenide and thickness of the quantum dot layer is less than 10 um; material of the second scattering layer is multi-arm titanium dioxide or multi-arm cadmium sulfide nanorod and thickness of the second scattering layers is less than 10 um.

* * * * *